(12) United States Patent
Sprouse et al.

(10) Patent No.: US 7,697,325 B2
(45) Date of Patent: Apr. 13, 2010

(54) NON-VOLATILE MEMORY CELL ENDURANCE USING DATA ENCODING

(75) Inventors: Steven T. Sprouse, San Jose, CA (US); Dhaval Parikh, Santa Clara, CA (US); Sukhminder S. Lobana, Fremont, CA (US); Shai Traister, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 60 days.

(21) Appl. No.: 11/903,764

(22) Filed: Sep. 24, 2007

(65) Prior Publication Data
US 2009/0080249 A1 Mar. 26, 2009

(51) Int. Cl.
*G11C 16/04* (2006.01)

(52) U.S. Cl. ............ 365/185.03; 365/236; 365/185.21; 365/185.11

(58) Field of Classification Search ............ 365/185.03, 365/185.17–185.19, 236, 185.21, 185.11, 365/189.07
See application file for complete search history.

(56) References Cited

U.S. PATENT DOCUMENTS

| | | | | |
|---|---|---|---|---|
| 5,847,991 A | * | 12/1998 | Tong et al. | ............. 365/185.03 |
| 6,483,742 B1 | * | 11/2002 | Sweha et al. | ........... 365/185.03 |

* cited by examiner

*Primary Examiner*—David Lam
(74) *Attorney, Agent, or Firm*—Brinks Hofer Gilson & Lione (57) ABSTRACT

A method and apparatus for storing an n-bit (for $n \geq 2$) data block in an array of non-volatile memory cells utilizes a predetermined n+k-bit (for $k \geq 1$) encoding selected to reduce the number of programmed cells required to store the n-bit data block.

42 Claims, 13 Drawing Sheets

PRIOR ART

| BLOCK SIZE | DATA "X" | PROGRAMMED BITS COUNT | ENCODED DATA "X" | ENCODED DATA PROGRAMMED BITS COUNT | PROGRAMMED BIT SAVINGS | AVERAGE SAVINGS (%) | FLAG BIT COST |
|---|---|---|---|---|---|---|---|
| 1 | 0 | 0 | 0-0 | 0 | 0 | | |
|   | 1 | 1 | 1-0 | 1 | 0 | | |
|   |   | — |   | — | — | | |
|   |   | 1 |   | 1 | 0 | 0% (0/1) | 1/1 |
| 2 | 00 | 0 | 00 - 0 | 0 | 0 | | |
|   | 01 | 1 | 01 - 0 | 1 | 0 | | |
|   | 10 | 1 | 10 - 0 | 1 | 0 | | |
|   | 11 | 2 | 00 - 1 | 1 | 1 | | |
|   |   | — |   | — | — | | |
|   |   | 4 |   | 3 | 1 | 25% (1/4) | 1/2 |
| 2 | 0000 | 4 | 1111-1 | 0 | 4 | | |
|   | 0001 | 3 | 1110-1 | 1 | 2 | | |
|   | 0010 | 3 | 1101-1 | 1 | 2 | | |
|   | 0011 | 2 | 1100-1 | 2 | 0 | | |
|   | 0100 | 3 | 1011-1 | 1 | 2 | | |
|   | 0101 | 2 | 1010-1 | 2 | 0 | | |
|   | 0110 | 2 | 1001-1 | 2 | 0 | | |
|   | 0111 | 1 | 0111-0 | 2 | -1 | | |
|   | 1000 | 3 | 0111-1 | 1 | 2 | | |
|   | 1001 | 2 | 0110-1 | 2 | 0 | | |
|   | 1010 | 2 | 0101-1 | 2 | 0 | | |
|   | 1011 | 1 | 1011-0 | 2 | -1 | | |
|   | 1100 | 2 | 0011-1 | 2 | 0 | | |
|   | 1101 | 1 | 1101-0 | 2 | -1 | | |
|   | 1110 | 1 | 1110-0 | 2 | -1 | | |
|   | 1111 | 0 | 1111-0 | 1 | -1 | | |
|   |   | — |   | — | — | | |
|   |   | 32 |   | 25 | 7 | 22% (7/32) | 1/4 |
| 8 | 0000 0000 | 8 | 1111 1111 - 1 | 0 | 8 | | |
|   | 0000 0001 | 7 | 1111 1110 - 1 | 1 | 6 | | |
|   |   |   | * * * * |   |   | | |
|   | 1111 1111 | 0 | 1111 1111 - 0 | 1 | -1 | | |
|   |   | — |   | — | — | | |
|   |   | 1024 |   | 837 | 187 | 18% (187/1024) | 1/8 |

| | 2-bit Encoding | # bits in programmed state |
|---|---|---|
| upage | 00 | |
| lpage | 00 | 2 |
| | | |
| upage | 01 | |
| lpage | 00 | 2 |
| | | |
| upage | 10 | |
| lpage | 00 | 2 |
| | | |
| upage | 11 | |
| lpage | 00 | 2 |
| | | |
| upage | 00 | |
| lpage | 01 | 2 |
| | | |
| upage | 01 | |
| lpage | 01 | 1 |
| | | |
| upage | 10 | |
| lpage | 01 | 2 |
| | | |
| upage | 11 | |
| lpage | 01 | 1 |

| | 2-bit Encoding | # bits in programmed state |
|---|---|---|
| upage | 00 | |
| lpage | 10 | 2 |
| | | |
| upage | 01 | |
| lpage | 10 | 2 |
| | | |
| upage | 10 | |
| lpage | 10 | 1 |
| | | |
| upage | 11 | |
| lpage | 10 | 1 |
| | | |
| upage | 00 | |
| lpage | 11 | 2 |
| | | |
| upage | 01 | |
| lpage | 11 | 1 |
| | | |
| upage | 10 | |
| lpage | 11 | 1 |
| | | |
| upage | 11 | |
| lpage | 11 | 0 |

Total # write/erase  24
Total write/erase per bit  12

Fig. 5

| | 2-bit Encoding | 3-bit Encoding | # bits in programmed state |
|---|---|---|---|
| upage | 00 | 111 | |
| lpage | 00 | 111 | 0 |
| upage | 01 | 101 | |
| lpage | 00 | 111 | 1 |
| upage | 10 | 011 | |
| lpage | 00 | 111 | 1 |
| upage | 11 | 110 | |
| lpage | 00 | 111 | 1 |
| upage | 00 | 111 | |
| lpage | 01 | 101 | 1 |
| upage | 01 | 101 | |
| lpage | 01 | 101 | 1 |
| upage | 10 | 011 | |
| lpage | 01 | 101 | 2 |
| upage | 11 | 110 | |
| lpage | 00 | 101 | 2 |

| | 2-bit Encoding | 3-bit Encoding | # bits in programmed state |
|---|---|---|---|
| upage | 00 | 111 | |
| lpage | 10 | 011 | 1 |
| upage | 01 | 101 | |
| lpage | 10 | 011 | 2 |
| upage | 10 | 011 | |
| lpage | 10 | 011 | 1 |
| upage | 11 | 110 | |
| lpage | 10 | 011 | 2 |
| upage | 00 | 111 | |
| lpage | 11 | 110 | 1 |
| upage | 01 | 101 | |
| lpage | 11 | 110 | 2 |
| upage | 10 | 011 | |
| lpage | 11 | 110 | 2 |
| upage | 11 | 110 | |
| lpage | 11 | 110 | 1 |

Total # write/erase = 21

Total write/erase per bit = 7

| n data bits | # erase cycles with n bit Encoding | # erase cycles with n+1 bit Encoding | # erase cycles reduction | % # bits increase |
|---|---|---|---|---|
| 2 | 24 | 21 | 12.5% | 50% |
| 3 | 144 | 120 | 16.7% | 33% |
| 4 | 768 | 645 | 16.0% | 25% |
| 5 | 3840 | 3258 | 15.2% | 20% |
| 6 | 18432 | 15624 | 15.2% | 17% |
| 7 | 86016 | 73104 | 15.0% | 14% |
| 8 | 393216 | 336213 | 14.5% | 13% |
| 10 | 7864320 | 6780114 | 13.8% | 10% |
| 12 | 150994944 | 131145456 | 13.1% | 8% |
| 13 | 654311424 | 570408972 | 12.8% | 8% |
| 14 | 2818572288 | 2463786180 | 12.6% | 7% |
| 15 | 12079595520 | 10588152576 | 12.3% | 7% |

NON-VOLATILE MEMORY CELL ENDURANCE USING DATA ENCODING

TECHNICAL FIELD

The present disclosure relates generally to the storage of data in non-volatile memory (NVM) devices.

BACKGROUND

Figure 1A:
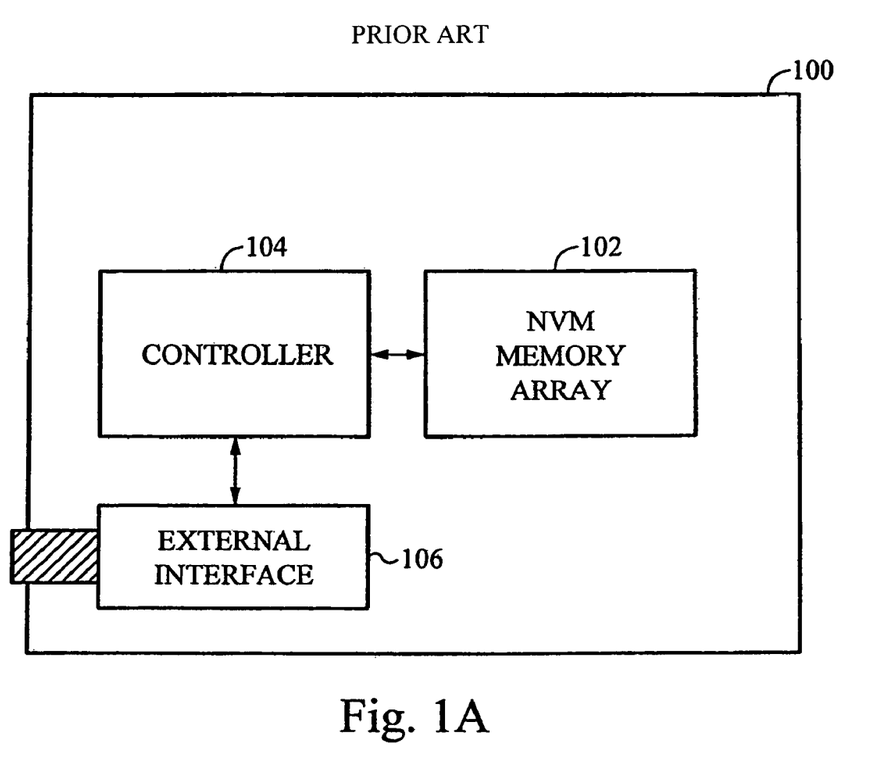
FIG. 1A is a block diagram illustrating a conventional NVM device.

Non-volatile memory devices are in common use today. Such devices are used for storage of data and programming instructions. They are frequently used for the storage of "content" in consumer electronic devices such as music players, telephones, navigation devices and electronic cameras. Most NVMs are configured generally as shown in block diagram form in FIG. 1A. The NVM device 100 of FIG. 1A comprises an NVM memory array 102 as described in more detail below, a controller 104 configured to execute instructions and process write commands and read commands so as to write to and read from memory array 102, and some kind of external interface 106 which may be an electrical circuit supporting communication with a device external to the NVM device 100. The interface may, for example, be a common interface such as Universal Serial Bus, Secure Digital, Compact Flash and the like.

Two common forms of NVM exist. One form is "binary" memory in which data is represented as one single binary bit per memory cell, the bit normally representing a binary "1" or "0". Another form is multi-level cell (MLC) memory in which one cell is used to store more than one binary bit.

Figure 1B:
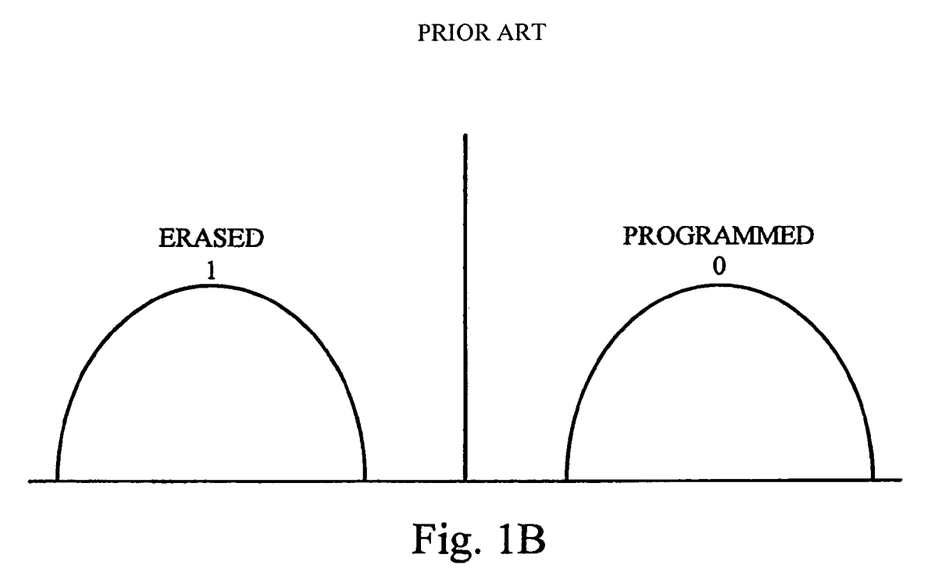
FIG. 1B is a charge plot illustrates charge distributions for the two states of a binary NVM cell.

Binary memory cells store charge on a floating gate of a floating gate transistor where different charge distributions correspond to the two different stored bit configurations. FIG. 1B is a charge plot illustrating charge distributions for the two states of such a binary NVM cell. These two configurations or states are illustrated as a "1" (erased) and a "0" (programmed). Note that this is only a convention and a "1" could instead represent a programmed bit and a "0" could likewise represent an erased bit. Accordingly, the 1=erased, 0=programmed convention will be used throughout this disclosure.

Figure 1C:
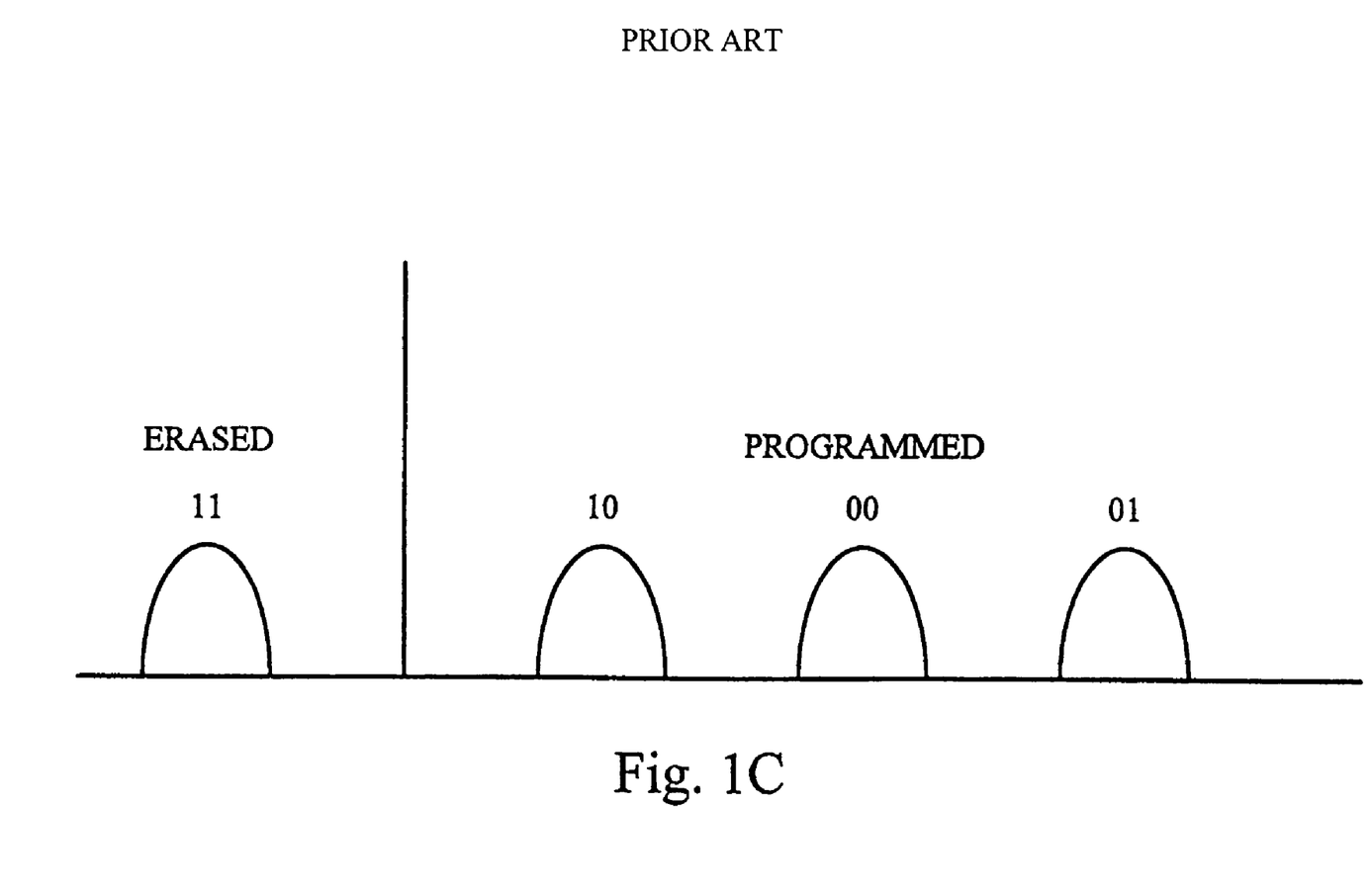
FIG. 1C is a charge plot illustrating charge distributions for the various states of a 2-bit MLC NVM cell.

MLC memory cells likewise store charge on a floating gate of a floating gate transistor where different charge distributions correspond to different stored bit configurations. For example, in a two-level MLC Flash memory two bits are stored in the cell and the two bits are referred to as an upper page bit (upage) and a lower page bit (lpage). Four charge distributions represent the four possible states of the upper and lower page bits. FIG. 1C is a charge plot illustrating charge distributions for the various states of a 2-bit MLC NVM cell. In FIG. 1C, the four charge distributions are illustrated as a "11", "10", "00" and "01". The "11" state is called the "erased" state. The remaining states are "programmed" states. (As discussed above with respect to binary memories, this is only a convention and while these states are referred to with "1"s and "0"s, it is not required that a "1" always represent a data 1 or that a "0" always represent a data 0. If desired, a "1" and a "0" may be interchanged).

Initially the cell is in the erased state. When the bits are programmed, the distribution is moved from the erased state on the left of FIGS. 1B and 1C to a programmed state on the right. Physically this corresponds to charge being stored on the floating gate. This is normally accomplished using an electron injection mechanism to force channel electrons across an insulator onto the floating gate. Cell erasure is normally achieved through a tunneling mechanism to remove electrons from the floating gate. The transition of a cell from the erased state to a programmed state and back to the erased state is called a "write/erase cycle". Each write/erase cycle causes "wear" on the cell and once a cell has accumulated enough wear, it may experience a failure mode. A cell already in the erased state experiences little or no wear when repeatedly erased.

It would be desirable to further improve the longevity and reliability of MLC memory cells.

OVERVIEW

A method and apparatus for storing an n-bit (for $n \geq 2$) data block in an array of non-volatile memory cells utilizes a predetermined n+k-bit (for $k \geq 1$) encoding selected to reduce the number of programmed cells required to store the n-bit data block. (Note that as used herein the symbol >= means greater than or equal, <= means less than or equal, and so forth).

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of an MLC Flash memory system. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings.

The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines, e.g., in a controller of a non-volatile memory device. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The number of ones (1's) in a data block such as a word of data is called its ones-count (e.g., the ones-count of "0110 1001" is 4). The ones-count for a standard binary encoding of an n-bit data word follows the binomial distribution where the number of n-bit numbers having k ones is given by $n!/(k!(n-k)!)$. Thus the probability of each bit in the data word being a 1 is 50%—just like tossing a coin. Likewise, the zeroes-count operates in the same manner for zeroes.

In traditional binary memories as illustrated in FIG. 1B, the memory is either set to a "0" (programmed in the convention used herein) or a "1" (erased in the convention used herein). In one embodiment using such memories, one can simply perform a zeroes-count of a data block to be written to memory (since zeroes are the programmed bits in this embodiment). If inverting the data block and SETing a flag bit associated with the data block results in fewer NET programmed cells (including the flag bit) than storing the original data block unchanged with the flag bit RESET, then the inversion and flag bit set is performed, otherwise it is not.

Encoding blocks of 2 or more bits (i.e., n>=2) can reduce the total number of programmed bits (e.g., those set to "0" using the conventions used herein) necessary to store a given amount of data. Blocks of 1 bit (i.e., n=1) provide no benefit because the number of programmed bits (data+flag) is not reduced by encoding.

Figure 2:
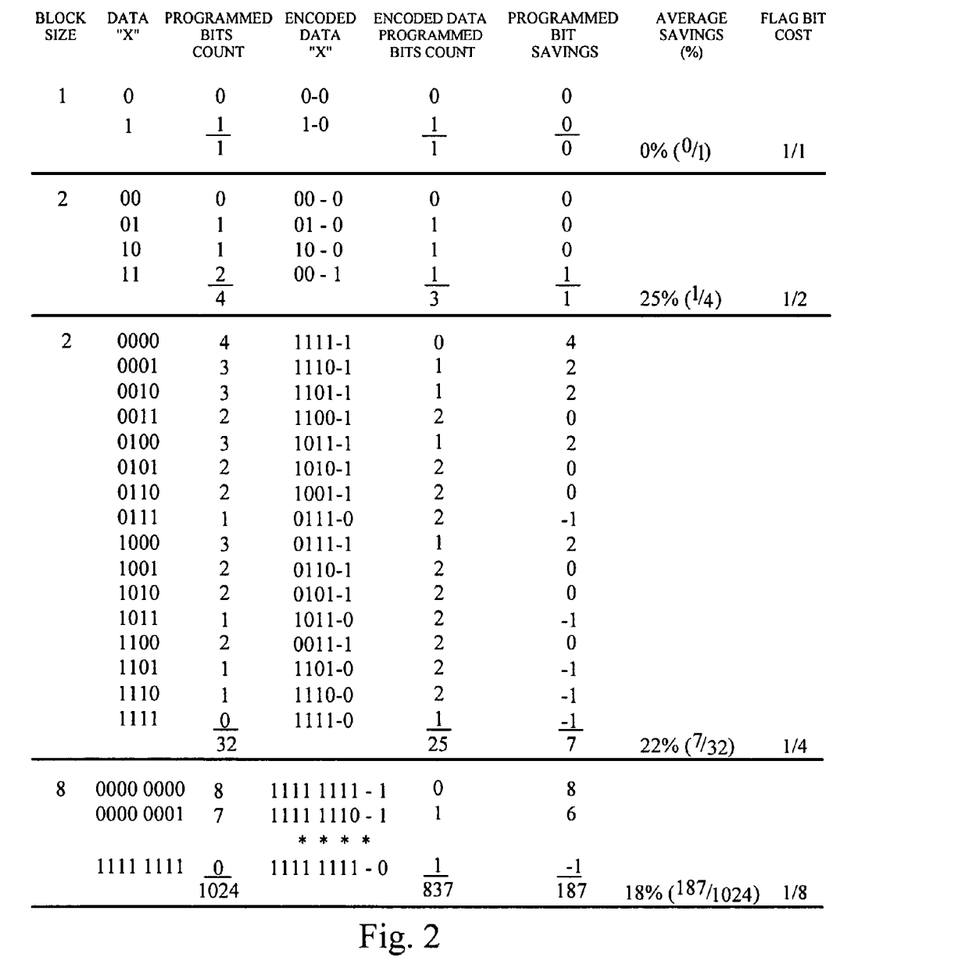
FIG. 2 is a table illustrating use of data encoding in a binary NVM array to reduce the total number of programmed cells in accordance with one embodiment.

FIG. 2 is a table illustrating use of data encoding in a binary NVM array to reduce the total number of programmed cells in accordance with one embodiment. The table of FIG. 2 illustrates this approach for data blocks of 1, 2, 4 and 8 bits. The first column of the table gives the block size in number of bits; the second column gives the binary data to be stored; the third column gives the number of programmed bits (programmed bits count) to store the data block without using encoding; the fourth column gives the encoded data in the format EE . . . EE-F where F is the flag state (0=SET, 1=RESET in one embodiment) and EE . . . EE is the encoded data (uninverted if F is RESET, inverted if F is SET); the fifth column gives the programmed bits count of the encoded data; the sixth column gives the net savings in programmed bits necessary to store the original data; and the seventh column gives the savings in percentage which can be expected by using the respective block size on average for random data.

As can be seen, without regard to the extra flag bits used, the savings are 25% (ones-count of 3 with encoding vs. 4 without) for blocks of 2 bits in size, 22% (ones-count of 25 with encoding vs. 32 without) for blocks of 4 bits in size, 18% (ones-count of 837 with encoding vs. 1024 without) for blocks of 8 bits in size; and so forth. In practice, larger data blocks consisting of hundreds or thousands (or more) bits may be used with the overall saving of programmed bits (including flag bits) approaching approximately 12% in the limit. These smaller data blocks are used here for purposes of illustration.

Turning now to the MLC NVM case, when a word (or block) of data is written to an MLC memory (such as Flash), only a subset of the memory cells that comprise the data word will need to enter the programmed state. Similarly to the binary case the binary data may be encoded before writing to an MLC NVM cell array in order to reduce the average number of write/erase cycles experienced by individual cells of the MLC NVM cell array when data is written to the MLC memory.

Figure 3:
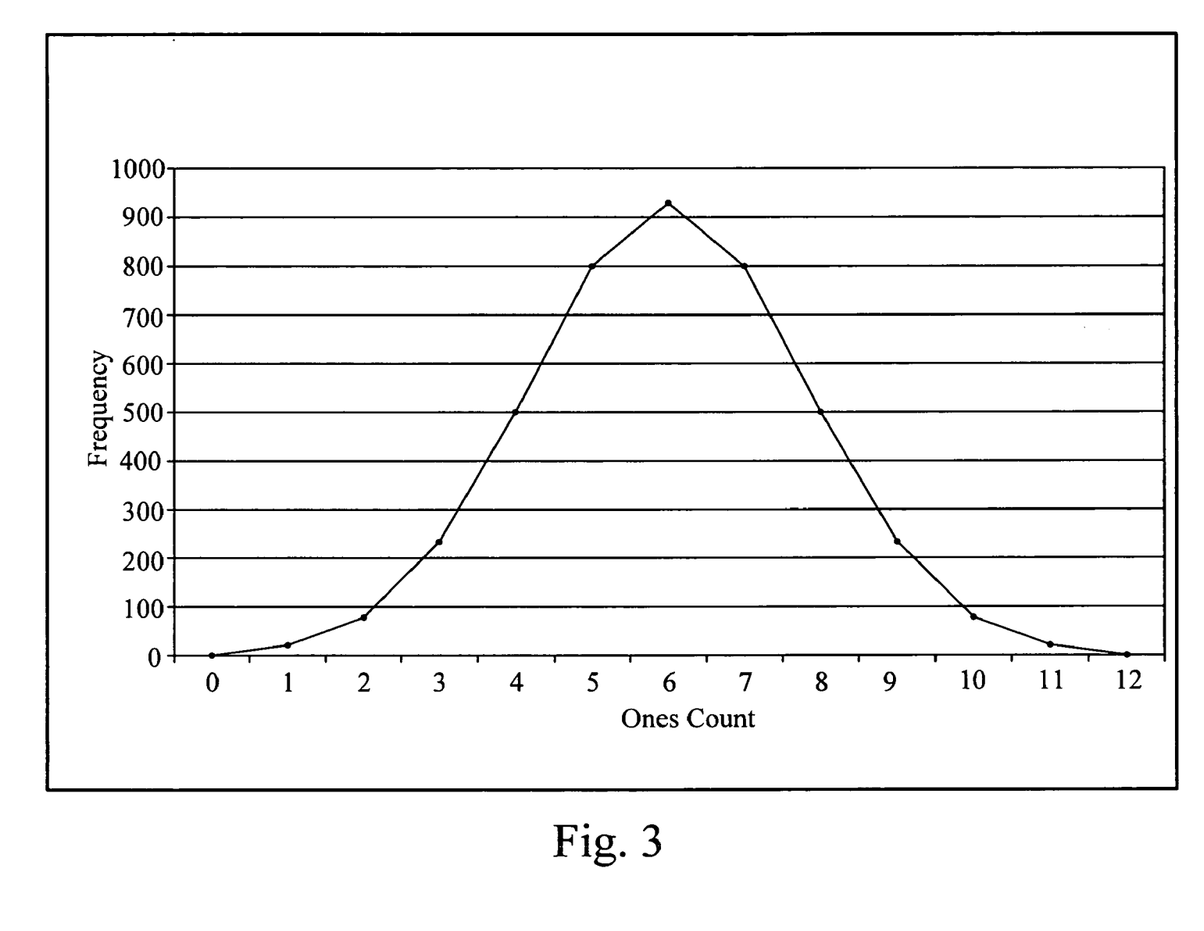
FIG. 3 is a plot of frequency vs. ones-count illustrating a binomial distribution for a 12-bit data word.

As pointed out above, the probability of each bit in a data word being a 1 is 50%, accordingly if two random bits are placed in an upper and lower page, respectively, of an MLC NVM memory cell, the odds of both bits being a 1 is 25% (50%*50%). FIG. 3 is a plot of frequency vs. ones-count illustrating a binomial distribution for a 12-bit data word. It thus turns out that by adding "k" additional bits, it is possible to change the n-bit encoding to an n+k-bit encoding with a ones-count distribution that is different from the original binomial distribution. The new distribution can be selected to favor encodings that have more than 50% 1s. This means that there is a greater than 50% chance that any given bit in a data word will be a 1, and therefore the chance of two bits superimposed on each other in a single cell have a greater than 25% chance of being in the "11" erased state.

Figure 4:
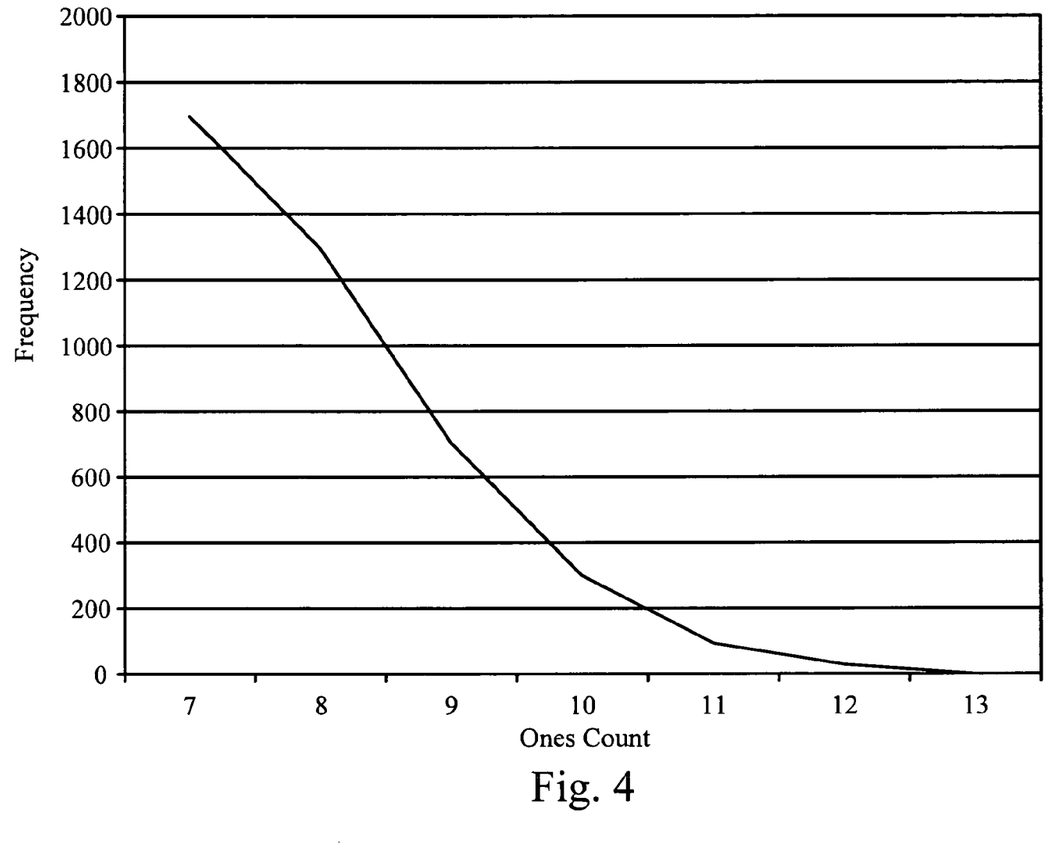
FIG. 4 is a plot of frequency vs. ones-count illustrating the distribution for the "right" half of a 13-bit binomial distribution.

For example, by adding one additional state bit to the 12-bit example discussed above, a 13-bit encoding (having twice the number of possible outcomes) is created where one-half of those outcomes may be used to hold a 12-bit data word. Since only half of the available 12-bit encodings are used, those encodings that contain more 1s than 0s can be selected for use. Accordingly, FIG. 4 is a plot of frequency vs. ones-count illustrating the distribution for the "right" half of a 13-bit binomial distribution. In this case, the average number of 1s (unprogrammed bits) per 13-bit encoding is 7.97 (versus 6 for the 12-bit encoding).

Although many such encodings may be used, one example of such an encoding is to add a single state bit which represents simply whether or not the n-bit data word is to be/has been inverted. By performing a programmed bits count on a data block, determining if an inversion will yield a fewer number of bits in the programmed state, and then, if so, inverting it and setting the inverted state bit, a simple implementation of the above technique can be had which is computationally simple and easily implemented (e.g., in the controller 104 of an NVM device).

Figure 5:
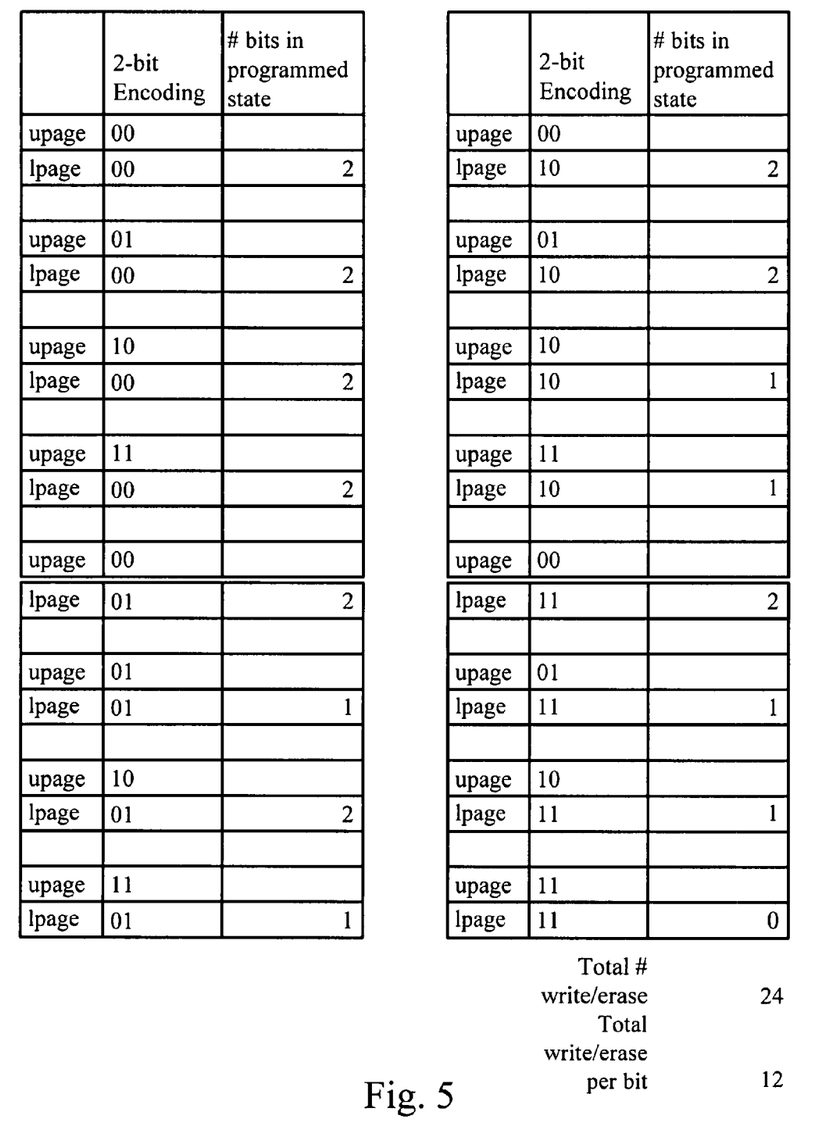
FIG. 5 is a table showing an example of the encoding of a 2-bit MLC NVM with standard encoding.

FIG. 5 is a table showing an example of the encoding of a 2-bit MLC NVM with standard encoding (16 examples: 0000-1111). The leftmost column indicates whether the bits are stored in the upper page (upage) or lower page (lpage). The second column indicates the 2-bit encoding. The third column indicates the number of bits in the programmed state for the given configuration. The 16 possible states require 24 write/erase cycles (or 12 per bit since there are two bits).

Figure 6:
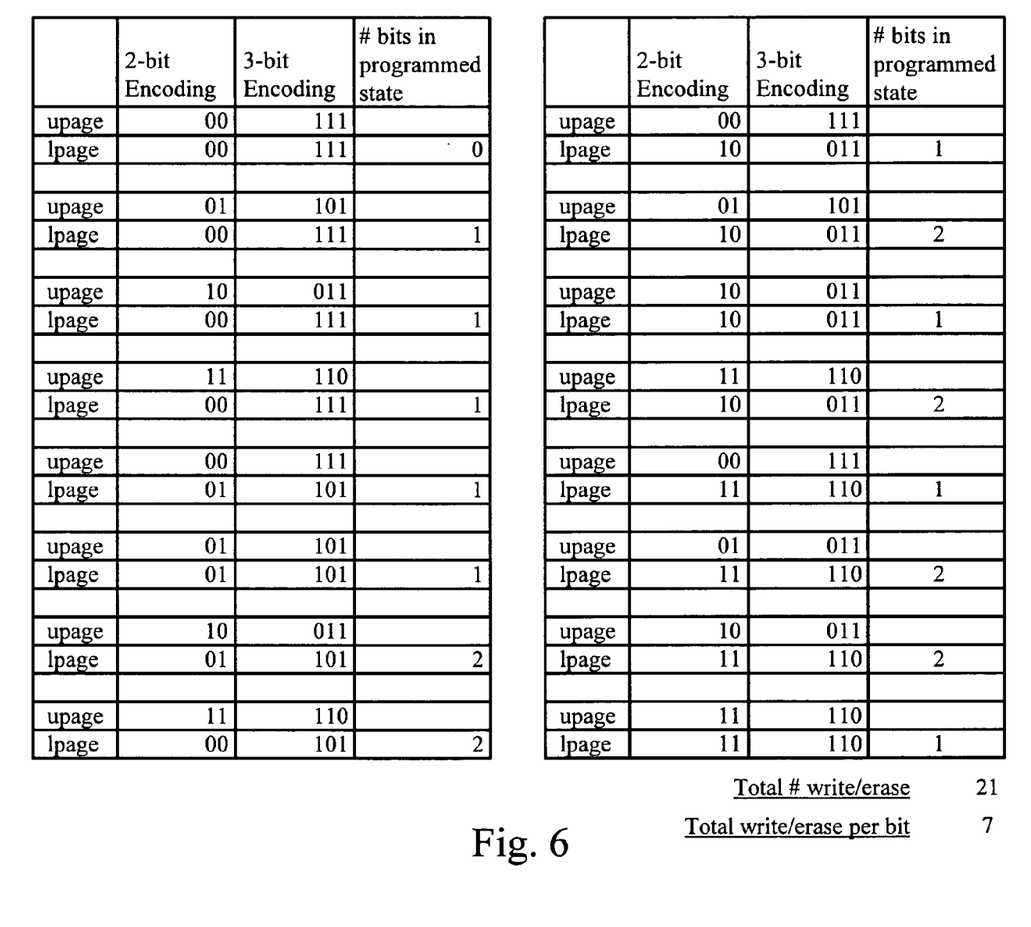
FIG. 6 is a table showing an example of the encoding of a 2-bit MLC NVM using a 3-bit encoding technique in accordance with one embodiment.

FIG. 6 is a table showing an example of the encoding of a 2-bit MLC NVM using a 3-bit encoding with an invert bit (16 examples: 0000-1111). The leftmost column indicates whether the bits are stored in the upper page (upage) or lower page (lpage); the second column indicates the 2-bit encoding; the third column indicates the 3-bit encoding; and the fourth column indicates the number of bits in the programmed state for the given configuration. The 16 possible states require only 21 write/erase cycles (or 7 per bit since there are three bits).

Figure 7:
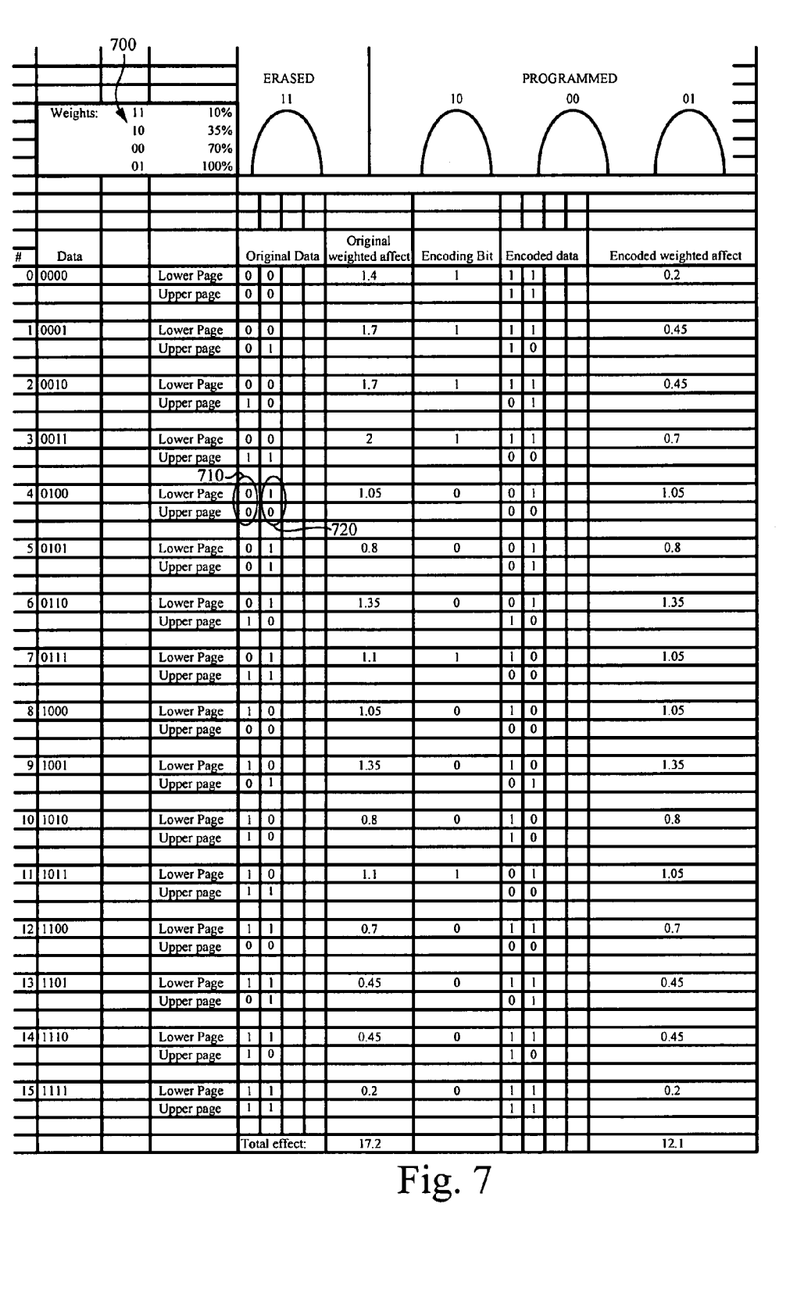
FIG. 7 is a table illustrating the encoding of a 2-bit MLC NVM using a 3-bit weighted encoding technique in accordance with one embodiment.

In accordance with another embodiment implemented in an MLC context, and as illustrated in FIG. 7, weights 700 are assigned to the various bit configurations that are possible. Because wear to the floating gate insulator is proportional to the amount of charge being injected into the floating cell, the farther charged the state is, the more charge is trapped and the higher its weighted effect is. In one embodiment the weights are assigned in an attempt to value the cost of particular bit configurations in this context. For example, the bit configuration "11" (upper page=UP=1=Least Significant Bit (LSB); lower page=LP=1=Most Significant Bit (MSB)) is assigned the weight of 10% (or 0.10); "10" (UP=0=LSB; LP=1=MSB) is assigned the weight of 35%; because it is "worse" than "11" but not as bad as "00" and "01"; "00" is assigned the weight of 70% and "01" is assigned the weight of 100% because it represents the most programmed state which would presumably lead to the most wear on the floating gate insulator. Other weights could alternatively be used. MLCs having more than four states could be used. The weights may be assigned arbitrarily if desired.

Using the value 4 (0100) as an example, under the earlier example it would be inverted (programmed bits=3, n=4, 3>=n/2), however, using this particular weighting approach, we see that 0100 would be stored as "00" (710), "10" (720) (read vertically in the "Original Data" column). The sum of the weights for this example is 1.05 (0.70+0.35). If this were to be inverted (ignoring effects due to the encoding bit), then the encoded data would be stored as "11", "01" with a total weight of 1.10 (0.10+1.00) which is "worse" in this example than 1.05. Thus, no inversion or encoding should be carried out. Those of ordinary skill in the art will now appreciate that the techniques shown and described herein can be expanded to many specific encodings which may be implemented with the use of algorithms, look-up tables, arbitrary encodings, and the like.

Figure 8:
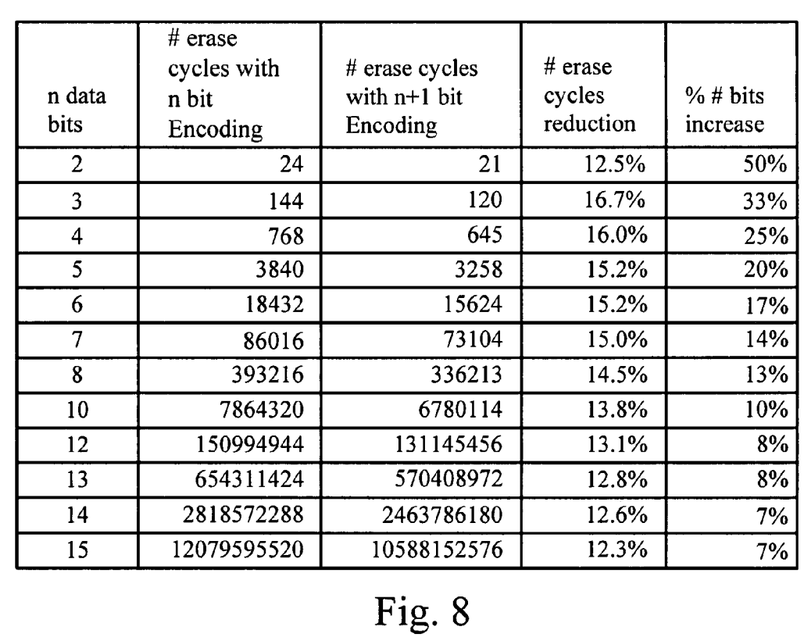
FIG. 8 is a table which shows the results of counting the number of bit write/erase cycles in a 2-bit MLC NVM for numbers having between 2 and 15 bits.

FIG. 8 is a table which shows the results of counting the number of bit write/erase cycles in a 2-bit MLC NVM for numbers having between 2 and 15 bits. The data show that for a data word width of 12 bits, an endurance improvement of 13% (reduction in the number of write/erase cycles) can be achieved with an increase of 8% in the number of bits used.

Figure 9A:
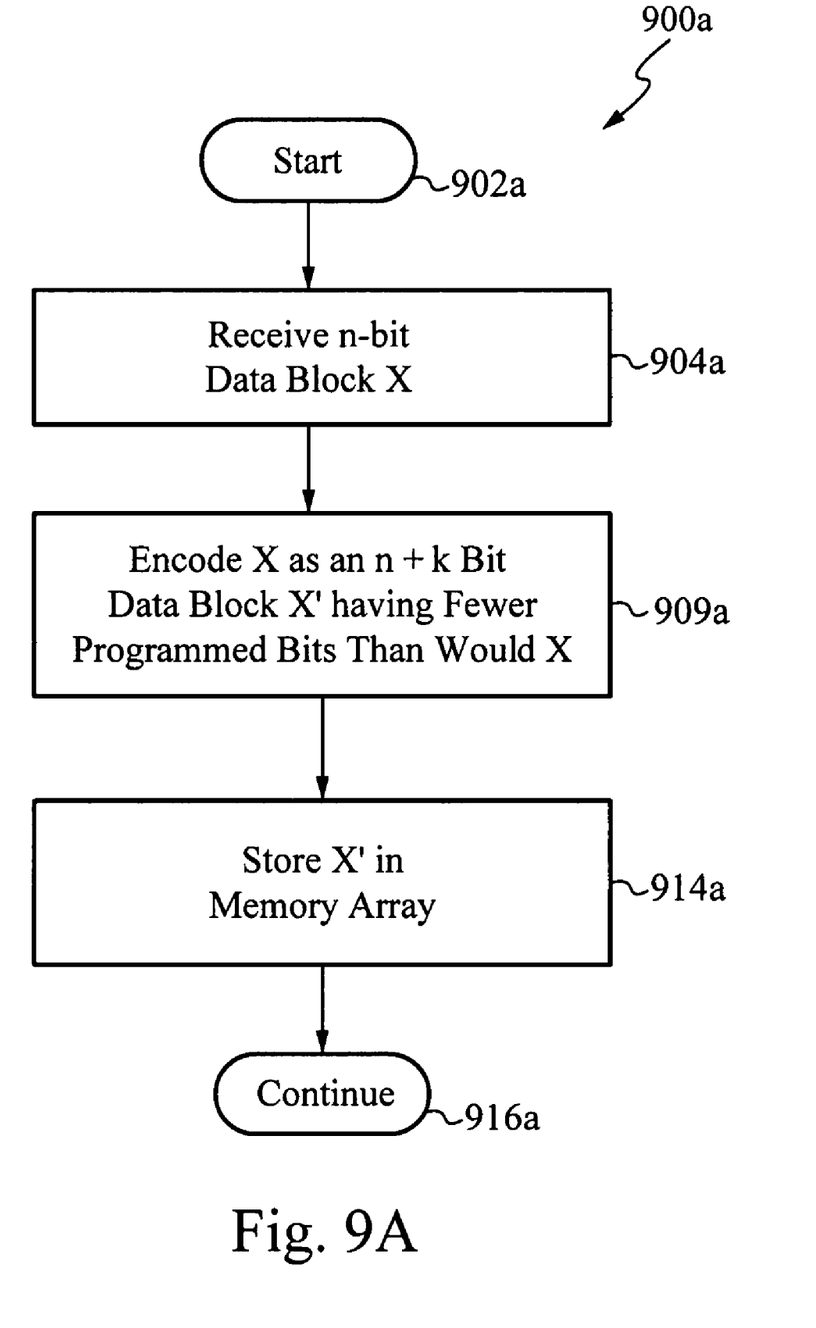
FIGS. 9A, 9B and 9C are process flow diagrams illustrating implementations used for encoding data in accordance with various embodiments.

FIG. 9A is a process flow diagram illustrating an implementation 900*a* which starts at block 902*a*. At block 904*a* the n-bit data block X begins processing by being received (for example, at controller 104). At block 909*a* data block X is encoded as an n+k-bit (n>=2, k>=1) data block X' having (on average) fewer programmed bits than would X if it were stored without encoding. At block 914*a* the encoded output X' is stored in the NVM memory array. At block 916*a* the process continues.

Figure 9B:
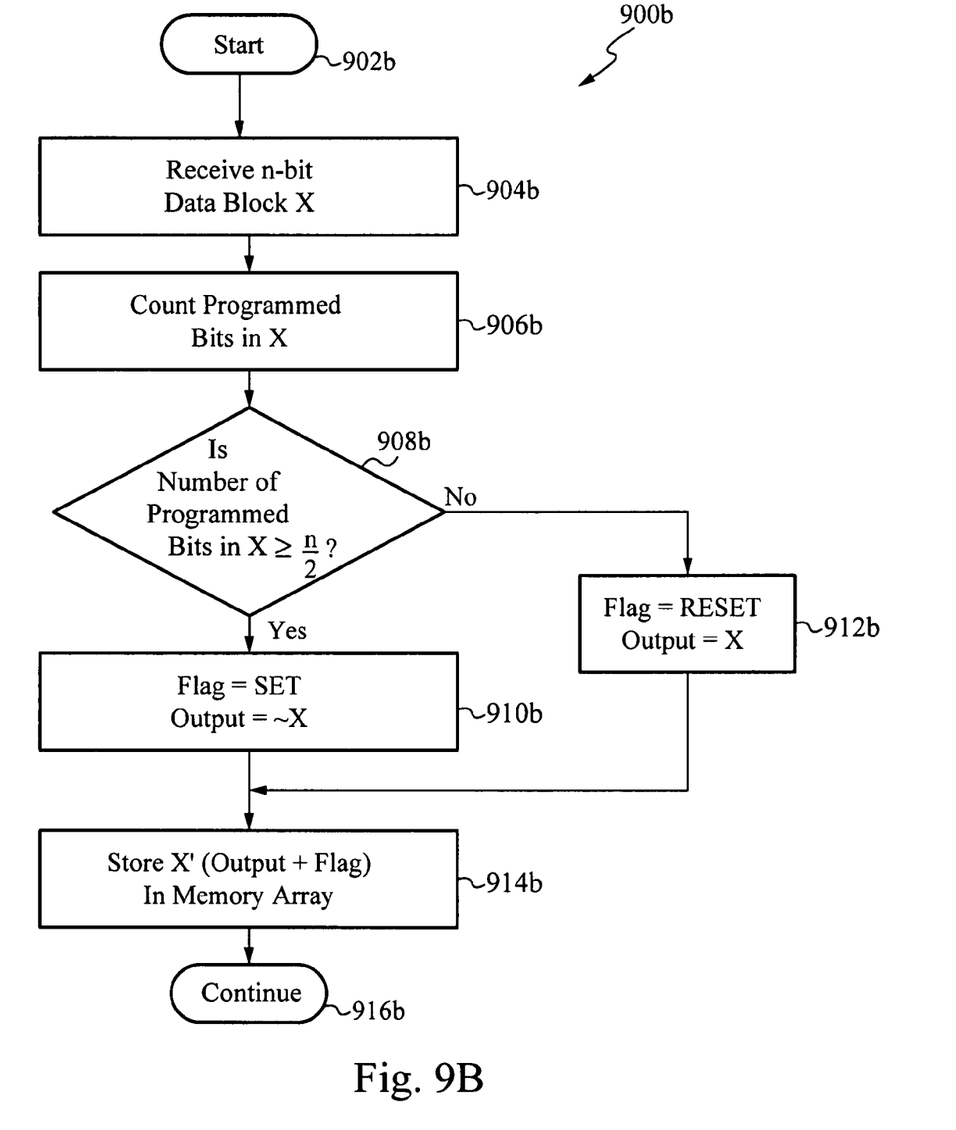

FIG. 9B is a process flow diagram illustrating an implementation 900*b* which starts at block 902*b*. At block 904*b* the n-bit data block X begins processing by being received (for example, at controller 104). At block 906*b* a programmed bits count is performed (meaning that the number of programmed bits required to store X in an unencoded form is determined (e.g., a zeroes-count in one implementation). At block 908*b* if the programmed bits count is greater than or equal to (>=) n/2 then at block 910*b* the state bit or flag is SET (e.g., =1) and the output is set to ~X (a bitwise inversion of the bits of X). At block 908*b* if the programmed bits count is less than (<) n/2 then at block 912*b* the state bit or flag is RESET (e.g., =0) and the output is set to X (uninverted). At block 914*b* the output X (or ~X) along with the state bit or flag (the combination being denoted as Output+Flag or X') is stored in the NVM memory array. Note that the state bit or flag may be stored in the NVM memory array 102 at a location proximate or contiguous to the storage location of the data word X/~X (e.g., as an n+k-bit data block) or, alternatively, the state bits or flags may be written in locations of a separate block of memory within the NVM memory array 102 corresponding to data words X/~X. At block 916*b* the process continues.

Figure 9C:
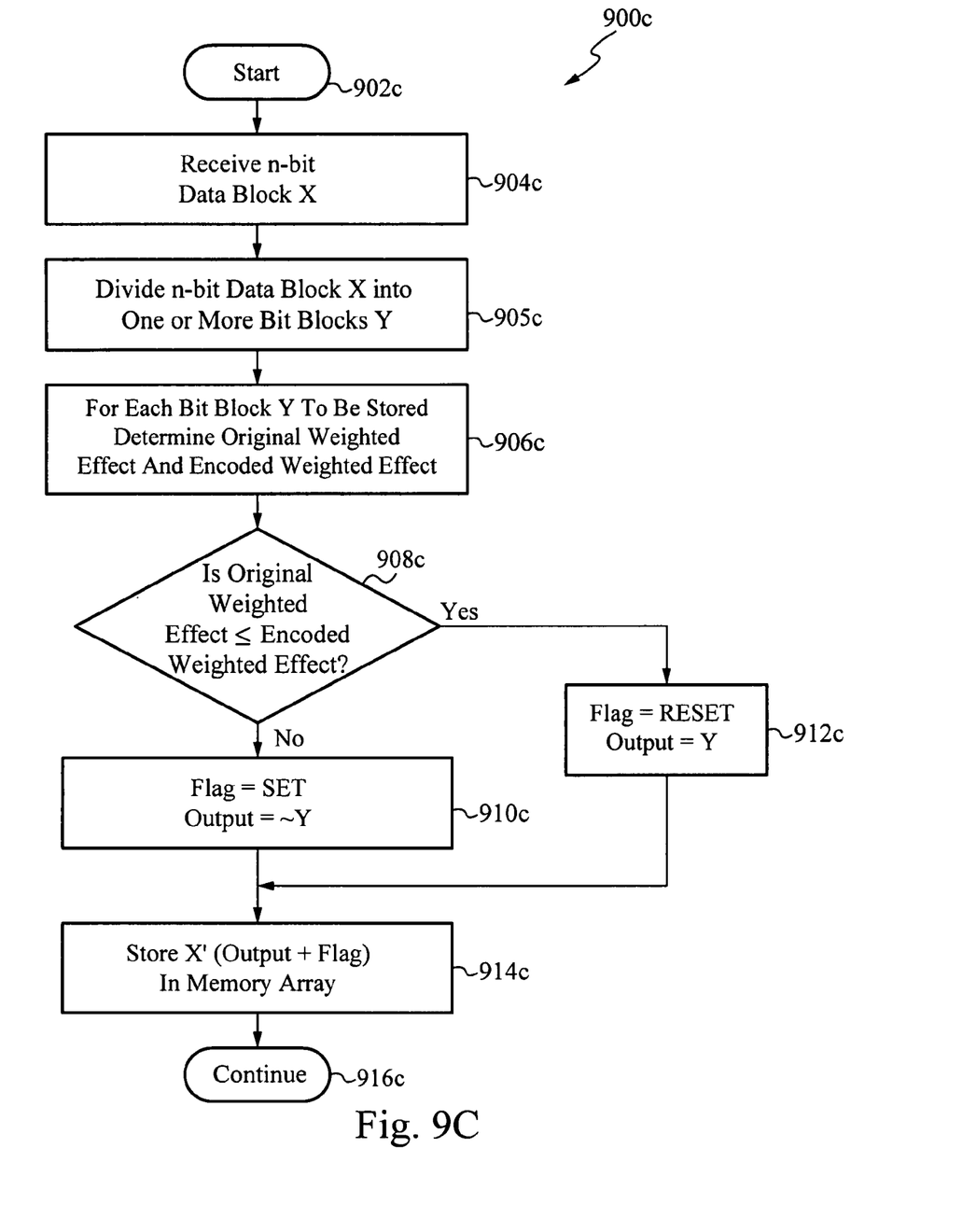

FIG. 9C is a process flow diagram illustrating an implementation 900*c* which starts at block 902*c*. At block 904*c* the n-bit data block X begins processing by being received (for example, at controller 104). X may be a small number of bits to be stored in a single NVM cell (binary or MLC) or it may be a larger number of bits to be stored in a plurality of such cells. Block 905*c* is an optional process where the n-bit data block X is divided into one or more bit blocks Y for storage. At block 906*c*, for each bit block Y to be stored, the original and encoded weight effects (OWE and EWE) are determined. These correspond to the "Original Weighted Effect" and "Encoded Weighted Effect" columns of FIG. 7. At block 908*c* these two values are compared and if in view of that comparison, encoding is not warranted, i.e., OWE<EWE (or in another embodiment OWE<=EWE), then at block 912*c* the flag is RESET and the output is Y. Alternatively if encoding is warranted, i.e., EWE<=OWE (or in another embodiment EWE<OWE) then at block 910*c* the flag is SET and the output is ~Y (a bitwise inversion of Y). It is a matter of design choice to determine how to proceed if OWE=EWE, however, if a SET flag uses an unprogrammed bit, then it would make sense to encode if there is a tie between EWE and OWE. At block 914*c* the output X (or ~X) along with the state bit or flag (the combination being denoted as Output+Flag or X') is stored in the NVM memory array. Note that the state bit or flag may be stored in the NVM memory array 102 at a location proximate or contiguous to the storage location of the data word X/~X (e.g., as an n+k-bit data block) or, alternatively, the state bits or flags may be written in locations of a separate block of memory within the NVM memory array 102 corresponding to data words X/~X. At block 916*c* the process continues.

Another alternative approach is that when comparing the OWE and EWE one can also take into account the weight of the "Flag bit". For example one can compare "OWE+Weight of '1'" to "EWE+Weight of '0'", or the like. This may be applied to the previous schemes as well. For example, instead of comparing the programmed bit count with n/2, one may compare it with (n/2)−1, since when there is no inversion there may be an additional zero bit (if FLAG=RESET=zero=programmed).

The approaches described herein reduce the number of bits necessary to be programmed in order to store data in binary and MLC NVM devices, thus providing reduced wear and potentially greater life. By so reducing the number of bits programmed, they also reduce the average power required to write those bits which can be important in portable battery-powered devices. A cost of these approaches is, of course, that the flag bits must be provided in (e.g.) the memory array, thereby reducing the number of bits available for data storage.

It should also be noted that instead of carrying out a programmed bit count on the data block, a look-up table approach may be used to implement a transformation of the input data block directly into an output encoded data word. It should also be noted that many possible encodings exist for any given n and k. For example, using the techniques illustrated in FIG. 9B or 9C, the flag bit could be SET or RESET to indicate an inversion and correspondingly RESET or SET to indicate no inversion; RESET could be denoted as 1 or it could be denoted as 0 and likewise SET could be denoted as 0 or it could be denoted as 1. Arbitrary encodings that achieve the goal of fewer programmed bits may be used even if they are not optimized to achieve a minimum number of programmed bits.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A non-volatile memory apparatus, comprising:
a non-volatile memory array; and
a controller in communication with the memory array, the controller configured to:
receive an n-bit data block which would, without encoding, require a first number of programmed bits to store in the memory array, n comprising an integer;
analyze at least a part of the n-bit data block;
determine whether to encode the n-bit data block based on the analysis; and
if it is determined to encode the n-bit data block based on the analysis, encode the n-bit data block as an n+k-bit data block, k comprising an integer, by inverting at least some the bits in the n-bit data block and instructing a second number of programmed bits to be stored in the memory array, the second number less, on average, than the first number.

2. The apparatus of claim 1, wherein the configuration of the controller to encode includes configuration to:
determine an original weighted effect (OWE) and an encoded weighted effect (EWE) for a plurality of bits to be stored in a memory cell using predetermined weights for each programming configuration and a predetermined encoding;
compare the OWE and the EWE and responsive thereto determine whether to encode the plurality of bits and SET a flag corresponding to the plurality of bits and indicating that they are encoded.

3. The apparatus of claim 2, wherein the predetermined encoding includes a bitwise inversion of the plurality of bits.

4. The apparatus of claim 2, wherein the configuration of the controller includes configuration to:
divide the n-bit data block into at least one bit block having one or more bits.

5. The apparatus of claim 1, wherein the configuration of the controller to encode includes configuration to determine an original weighted effect (OWE) and an encoded weighted effect (EWE) for a plurality of bits to be stored in a memory cell using predetermined weights for each programming configuration and a predetermined encoding;
compare the OWE plus the weight of a RESET flag and the EWE plus the weight of a SET flag and responsive thereto determine whether to encode the plurality of bits and SET a flag corresponding to the plurality of bits and indicating that they are encoded.

6. The apparatus of claim 1, wherein the configuration of the controller to encode includes configuration to:
obtain a programmed bits count of the number of bits in the n-bit data block set to a first state,
compare the programmed bits count to (n/2)−1 and, responsive to a first possible result of the comparison, SET a flag and store in the array a representation of the n-bit data block as an inverse of the bits in the n-bit data block, and responsive to a second possible result of the comparison, RESET a flag and store a representation of the n-bit data block as the n-bit data block in the array.

7. The apparatus of claim 1, wherein the controller analyzes at least a part of the n-bit data block by determining a programmed bits count of the number of bits in the n-bit data block set to a first state; and
wherein the controller determines whether to encode the n-bit data block by comparing the programmed bits count to a predetermined number.

8. The apparatus of claim 1, wherein the controller analyzes at least a part of the n-bit data block by weighting a plurality of bits to be stored in a memory cell and by weighting an encoded plurality of bits; and
wherein the controller determines whether to encode the n-bit data block by comparing the weighting of the plurality of bits with the weighting the encoded plurality of bits.

9. A non-volatile memory apparatus, comprising:
a non-volatile memory array; and
a controller in communication with the memory array, the controller configured to:
receive an n-bit data block which would, without encoding, require a first number of programmed bits to store in the memory array, n comprising an integer; and
encode the n-bit data block as an n+k-bit data block, k comprising an integer, by inverting the bits in the n-bit data block and instructing a second number of programmed bits to be stored in the memory array, the second number less, on average, than the first number,
wherein the configuration of the controller to encode includes configuration to:
obtain a programmed bits count of the number of bits in the n-bit data block set to a first state;
compare the programmed bits count to n/2 and, responsive to a first possible result of the comparison, SET a flag and store in the array a representation of the n-bit data block as an inverse of the bits in the n-bit data block, and responsive to a second possible result of the comparison, RESET a flag and store a representation of the n-bit data block as the n-bit data block in the array.

10. The apparatus of claim 9, wherein the controller is configured so that the first state is "0".

11. The apparatus of claim 9, wherein the controller is configured so that the first state is "1".

12. The apparatus of claim 9, wherein the controller is configured to store the flag in the array with the representation of the n-bit data block.

13. The apparatus of claim 9, wherein the controller is configured to store the flag in the array in a block of memory separate from the representation of the n-bit data block.

14. The apparatus of claim 9, wherein the controller is configured to store the flag in the array contiguously with the representation of the n-bit data block.

15. The apparatus of claim 9, wherein the first possible result is that the count is greater than or equal to n/2.

16. The apparatus of claim 9, wherein the second possible result is that the count is less than n/2.

17. The apparatus of claim 9, wherein the first possible result is that the count is less than n/2.

18. The apparatus of claim 9, wherein the second possible result is that the count is greater than or equal to n/2.

19. The apparatus of claim 9, wherein the memory array includes binary memory configured to store the representation of the n-bit data block.

20. The apparatus of claim 9, wherein the memory array includes MLC memory configured to store the representation of the n-bit data block.

21. A method for storing an n-bit data block in a memory array of a non-volatile memory apparatus, the method comprising:
    receiving an n-bit data block which would, without encoding, require a first number of programmed bits to store in the memory array, n comprising an integer;
    analyzing at least a part of the n-bit data block;
    determining whether to encode the n-bit data block based on the analysis;
    if it is determined to encode the n-bit data block based on the analysis, encoding the n-bit data block as an n+k-bit data block, k comprising an integer, by inverting at least some of the bits in the n-bit data block and instructing a second number of programmed bits to be stored in the memory array, the second number being less, on average, than the first number; and
    storing the n+k-bit encoded data block in the memory array.

22. The method of claim 21, wherein the encoding includes obtaining a programmed bits count of the n-bit data block; and
    comparing the programmed bits count to n/2.

23. The method of claim 22, wherein the storing includes:
    responsive to a first possible result of the comparison, SETing a k-bit flag and storing in the array a representation of the n-bit data block as an inverse of the bits in the n-bit data block, and responsive to a second possible result of the comparison, RESETing a k-bit flag and storing a representation of the n-bit data block as the n-bit data block in the array.

24. The method of claim 21, wherein the encoding includes:
    determining an original weighted effect (OWE) and an encoded weighted effect (EWE) for a plurality of bits to be stored in a memory cell using predetermined weights for each programming configuration and a predetermined encoding;
    comparing the OWE and the EWE and responsive thereto determining whether to encode the plurality of bits and SET a flag corresponding to the plurality of bits and indicating that they are encoded.

25. The method of claim 24, wherein the predetermined encoding implements at least a bitwise inversion of the plurality of bits.

26. The method of claim 24, wherein the encoding includes:
    dividing the n-bit number into at least one bit block having one or more bits.

27. The method of claim 21, wherein the encoding includes:
    determining an original weighted effect (OWE) and an encoded weighted effect (EWE) for a plurality of bits to be stored in a memory cell using predetermined weights for each programming configuration and a predetermined encoding;
    comparing the OWE plus the weight of a RESET flag and the EWE plus the weight of a SET flag and responsive thereto determining whether to encode the plurality of bits and SET a flag corresponding to the plurality of bits and indicating that they are encoded.

28. The method of claim 21, wherein the encoding includes:
    obtaining a programmed bits count in the n bit number; and
    comparing the programmed bits count to (n/2)−1 and, responsive to a first possible result of the comparison, SETing a flag and storing in the array a representation of the n-bit number as an inverse of the bits in the n-bit number, and responsive to a second possible result of the comparison, RESETing a flag and storing a representation of the n-bit number as the n-bit number in the array.

29. The method of claim 21, wherein analyzing at least a part of the n-bit data block comprises determining a programmed bits count of the number of bits in the n-bit data block set to a first state; and
    wherein determining whether to encode the n-bit data block comprises comparing the programmed bits count to a predetermined number.

30. The method of claim 21, wherein analyzing at least a part of the n-bit data block comprises weighting a plurality of bits to be stored in a memory cell and by weighting an encoded plurality of bits; and
    wherein determining whether to encode the n-bit data block comprises comparing the weighting of the plurality of bits with the weighting the encoded plurality of bits.

31. A method for storing an n-bit binary number in a memory array of a non-volatile memory apparatus, n comprising an integer, the method comprising:
    obtaining a count of the number of bits set to a first state in the n-bit number,
    comparing the count to n/2;
    resetting a flag and storing a representation of the n-bit number in the array, responsive to a first possible result of the comparing; and
    setting a flag and storing in the array a representation of an inverse of the n-bit number, responsive to a second possible result of the comparing.

32. The method of claim 31, wherein the first state is "0".

33. The method of claim 31, wherein the first state is "1".

34. The method of claim 31, wherein the storing includes storing The flag with the representation of the n-bit number.

35. The method of claim 31, wherein the storing includes storing the flag in the array in a block separate from the stored representation of the n-bit number.

36. The method of claim 31, wherein the storing includes storing the flag in the array contiguous to the stored representation of the n-bit number.

37. The method of claim 31, wherein the first possible result is that the count is greater than or equal to n/2.

38. The method of claim 31, wherein the second possible result is that the count is less than n/2.

39. The method of claim 31, wherein the first possible result is that the count is less than n/2.

40. The method of claim 31, wherein the second possible result is that the count is greater than or equal to n/2.

41. The method of claim 31, wherein the NVM apparatus comprises binary memory.

42. The method of claim 31, wherein the NVM apparatus comprises MLC memory.

* * * * *

UNITED STATES PATENT AND TRADEMARK OFFICE
CERTIFICATE OF CORRECTION

PATENT NO. : 7,697,325 B2 Page 1 of 1
APPLICATION NO. : 11/903764
DATED : April 13, 2010
INVENTOR(S) : Steven T. Sprouse et al.

It is certified that error appears in the above-identified patent and that said Letters Patent is hereby corrected as shown below:

In the Claims

In column 8, claim 6, line 9, immediately after "a first state" replace "," with --;--.

In column 10, claim 31, line 35, immediately after "the n-bit number" replace "," with --;--.

In column 10, claim 34, line 46, before "flag with the" replace "The" with --the--.

Signed and Sealed this

Eighth Day of June, 2010

David J. Kappos
*Director of the United States Patent and Trademark Office*